(12) United States Patent
Aumuller et al.

(10) Patent No.: US 7,170,107 B2
(45) Date of Patent: Jan. 30, 2007

(54) IC CHIP HAVING A PROTECTIVE STRUCTURE

(75) Inventors: Christian Aumuller, Weilheim (DE); Marcus Janke, Munich (DE)

(73) Assignee: Infineon Technologies AG, Munich (DE)

( * ) Notice: Subject to any disclaimer, the term of this patent is extended or adjusted under 35 U.S.C. 154(b) by 92 days.

(21) Appl. No.: 10/781,359

(22) Filed: Feb. 17, 2004

(65) Prior Publication Data

US 2005/0029653 A1    Feb. 10, 2005

Related U.S. Application Data

(63) Continuation of application No. PCT/DE02/02955, filed on Aug. 12, 2002.

(30) Foreign Application Priority Data

Aug. 16, 2001   (DE)   ................. 101 40 045

(51) Int. Cl.
*H01L 29/74* (2006.01)
*H01L 31/111* (2006.01)

(52) U.S. Cl. ..................... 257/173; 257/546
(58) Field of Classification Search ........ 257/173, 257/360, 546
See application file for complete search history.

(56) References Cited

U.S. PATENT DOCUMENTS

| 4,910,707 A | 3/1990 | Schrenk |
| 4,952,796 A | 8/1990 | Fruhauf et al. |
| 5,349,249 A | 9/1994 | Chiang et al. |
| 5,640,347 A | 6/1997 | Lin et al. |
| 6,072,328 A | 6/2000 | Takuma |
| 2002/0130248 A1* | 9/2002 | Bretschneider et al. . 250/214 R |

FOREIGN PATENT DOCUMENTS

| DE | 196 01 390 C2 | 7/1998 |
| DE | 101 01 995 A1 | 7/2002 |
| EP | 0 874 401 A2 | 10/1998 |
| EP | 0 978 844 A1 | 2/2000 |
| FR | 2 764 977 A1 | 12/1998 |

OTHER PUBLICATIONS

Sze, S.M.: "Physics of Semiconductor Devices 2nd"; 1981, John Wiley and Sons, Canada.

* cited by examiner

*Primary Examiner*—Hoai Pham
(74) *Attorney, Agent, or Firm*—Dickstein, Shapiro, LLP.

(57) ABSTRACT

An IC chip having a protective structure that is distributed over the semiconductor chip in such a manner that it is not possible to trigger a malfunction in the circuit by means of irradiation without the protective structure also being affected by the irradiation. To this end, redundant conductors are provided or connections having radiation-dependent conductivity or dielectric constant are provided or the test lines of a memory are arranged between the bit lines.

8 Claims, 1 Drawing Sheet ized memory elements such as, for example, in EEPROMs.
IC CHIP HAVING A PROTECTIVE STRUCTURE

CROSS-REFERENCE TO RELATED APPLICATION

This application is a continuation of International Patent Application Serial No. PCT/DE02/02955, filed Aug. 12, 2002, which published in German on Feb. 27, 2003 as WO 03/017350 A2, and which is incorporated herein by reference in its entirety.

FIELD OF THE INVENTION

The present invention relates to a semiconductor chip having a protective structure for protecting against a malfunction caused by irradiation, the chip being intended, in particular, for use in smart cards.

BACKGROUND OF THE INVENTION

The function of integrated circuits in semiconductor chips may be adversely affected by electromagnetic or radioactive irradiation. The irradiation may generate free charge carriers in the semiconductor material, the charge carriers generating undesirable currents when potential differences are present. These currents give rise to a malfunction or at least a change in function in the integrated circuit. For applications relevant to security, semiconductor chips are therefore provided with protective structures which, for example, may be formed by shields on the top side of the chip. Shields of this type may be formed by protective layers comprising an electrically insulating material which is impermeable to radiation; instead, provision may also be made of suitably patterned electrical conductors which, apart from shielding, also make it possible to electronically detect irradiation. Various technical realizations of protective structures comprising sensors are known, the sensors being used to detect irradiation of a semiconductor chip. Sensors of this type are arranged in the vicinity of those regions of the integrated circuit which are adversely affected by irradiation. However, it has been shown that the irradiation may be focused in such a manner or, using masks, may be directed toward particular parts of the circuit in such a manner that although functional disturbances are produced, none of the sensors provided responds. This problem arises, in particular, in semiconductor memory elements such as, for example, in EEPROMs.

DE 196 01 390 C2 specifies a microchip having a light-sensitive element, which may be an element which changes its electrical properties when light is incident, the changed electrical properties being used to realize a switching function.

EP 0 874 401 A2 describes an interconnect, which is intended as an optical cover and is arranged in alternating mutually opposite directions, the interconnect covering the top side of the IC chip. A connected circuit checks the intactness of the cover on the basis of an electrical voltage applied to the interconnect.

SUMMARY OF THE INVENTION

An object of the present invention is to specify an IC chip having a protective structure, which is sufficiently effective against external irradiation and, in particular, also protects against focused radiation.

The IC chip according to the invention indicates possibilities regarding the manner in which the protective structure is distributed over the semiconductor chip in such a way that it is not possible, by means of irradiation, to trigger a malfunction in a region of the integrated circuit without the protective structure also being affected by the irradiation in a detectable manner.

A first of these possibilities, which is advantageous, in particular, in connection with semiconductor memory components, provides for at least one electrical conductor (which is present in the integrated circuit) or at least one electrically conductive connection to be provided, in a redundant manner, with a further electrical conductor or with an identical connection, which is respectively in the form of a doped region in the semiconductor material. The effect achieved by this is that any external electromagnetic or radioactive irradiation affecting an electrical conductor of the integrated circuit also affects the associated doped region and generates free charge carriers there which give rise to a flow of current during operation of the circuit. This flow of current may be detected by a connected circuit.

This possibility is particularly advantageous in connection with the data lines of a memory component. The doped regions may be aligned under the data line, in particular the bit lines. Since the data lines form a dense grid on the top side of the IC chip, any irradiation will generate charge carriers at least in one doped region running parallel to these data lines, the charge carriers resulting in an unusually high flow of current in the data line in question. External irradiation at an arbitrary location on the top side of the IC chip may be detected in this manner.

An alternative protection mechanism for an IC chip provided with a memory, in particular with an EEPROM, uses the transmission of additional data (which is carried out anyway) as check digits or a code number in order to detect external irradiation. That is to say, when reading memory cells, redundant bits are concomitantly transmitted for the purpose of error correction. This additional information is used to check whether the data transmitted on the data lines are corrupted.

The further data lines for these check digits or code numbers are arranged between the data lines which are intended for transmitting the actual information. An algorithm, in which the further data are selected to be as complementary as possible to the data to be transmitted, is provided for correcting a defective data transmission, if necessary, on the basis of the redundant bits transmitted on the further data lines. The check bit "F" of the number 15 is, for example, formed in a hexadecimal number system for a stored value "00". Selecting the further data (which are provided for the purpose of correction) in this manner achieves the effect that external irradiation of the IC chip changes the information carried on the data lines all in the same direction. By way of example, all bits are changed to the logic value "1" irrespective of whether a "0" or a "1" was initially transmitted.

It emerges from the particular selection of the check digits or code numbers formed that, when the data are changed by irradiation, the check bits, with the exception of an insignificantly small number of special cases, do not match the transmitted information. The correction algorithm provided will therefore ascertain corruption of the transmitted data which is so extensive that corruption of the data by external irradiation may be assumed and appropriate countermeasures may possibly be initiated. Since the check bits are calculated in an unambiguously determined manner from the data to be transmitted, it is virtually no longer possible in this refinement of the IC chip to prevent triggering of a protection function provided in the circuit by changing the further data in a suitable manner together with the transmitted information. That part of the circuit, in which the correction algorithm is implemented, is preferably configured in such a manner that, in the event of a change in function caused by irradiation or corruption of the transmitted data, a signal is output such as is also emitted by a protection circuit provided with a sensor.

A further exemplary embodiment provides for a shield, which is present on the chip anyway and is formed from patterned electrical conductors, to be modified to the effect that external electromagnetic or radioactive irradiation may be detected. The shield is usually present in a topmost metallization plane of the chip. If a plurality of metallization planes are provided for the electrical interconnection, they are isolated from one another by intermetal dielectrics. The latter are usually oxide layers, for example silicon dioxide. A passivation or protective layer for protecting against external stress may be provided on the top side of the topmost metallization plane, that is to say that metallization plane which is furthest away from the semiconductor material of the chip. A passivation of this type usually likewise comprises electrically insulating material.

At least one of the layers above or below the topmost metallization plane or in the interspaces between the patterned electrical conductors of this metallization plane is a particular dielectric material, which, upon the action of external electromagnetic or radioactive irradiation, undergoes a change in its relative permittivity to an extent which is relevant in terms of circuitry. This may be effected, in particular, by a change in the number of free charge carriers present in the material. The relative permittivity always changes in such a manner that the change can be detected by means of circuitry, for example by determining the change in the electrical capacitance between the electrical conductors which are embedded in the material or adjoin the material.

A further possibility is to provide a material between the electrical conductors, the electrical resistance of the material, in the event of external irradiation, decreasing in such a manner that a certain electrical conductivity between two electrical conductors (insulated from one another beforehand) can be detected through this material or a conductive connection, a short circuit in the extreme case, is even produced between the conductors.

The features of the above-described exemplary embodiments may be combined with one another in a selection which is in principle arbitrary, it being possible for this to result in a considerable improvement in the protective action. In particular, a combination of all the specified means may be preferred in order to protect memory chips against irradiation.

BRIEF DESCRIPTION OF THE DRAWINGS

A more precise description of exemplary embodiments of the IC chips follows with reference to the appended FIGS. 1 to 3.

DETAILED DESCRIPTION OF THE PREFERRED MODE OF THE INVENTION

Figure 1:
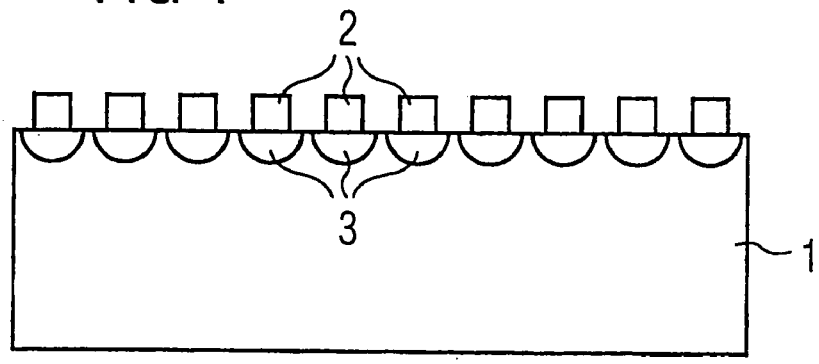
FIG. 1 shows a diagrammatic cross section through an IC chip having redundant conductive connections.

FIG. 1 illustrates a first exemplary embodiment of an IC chip, the internal structure of which may in principle be arbitrary and in this case is represented by a semiconductor body or by a substrate 1. Electrical conductors 2 which are indicated here by the cross sections of bit lines or word lines are situated on the substrate. Strip-type doped regions 3 which are arranged parallel to the conductors 2 are situated under the latter in the semiconductor material. Mobile charge carriers in the material are generated in the doped regions 3 by means of particular external electromagnetic or radioactive irradiation operations. If an electric current flows in the conductors 2, the current intensity is increased, in the event of external irradiation, by the free charge carriers occurring in the doped regions 3. This increased current intensity may be detected and is an indication of the fact that the functioning of the circuit is changed by external irradiation.

The doped regions 3 do not need to be connected to the conductors in the manner illustrated in FIG. 1. A spacing may be present between the conductors 2 and the doped regions 3, it being possible for the spacing to even be bridged by an electrically insulating material. The doped regions 3 may also be laterally offset with respect to the conductors, with the result that, in the example illustrated in FIG. 1, the doped regions may also be arranged between the regions of the substrate which are provided with the conductors 2. The doped regions 3 do not need to be present over the entire length of the conductors 2. It suffices if the doped regions are present in a section which is possibly exposed to irradiation or a plurality of sections of this type and are arranged in such a manner that they are likewise included by the irradiation. The doped regions are preferably provided with separate electrical connections to the circuit provided, so that, on the one hand, it is possible to dispense with a low-resistance conductive connection to the conductors 2 and, on the other hand, it is possible to detect more efficiently a current occurring in the doped regions in the event of electromagnetic or radioactive irradiation.

Figure 2:
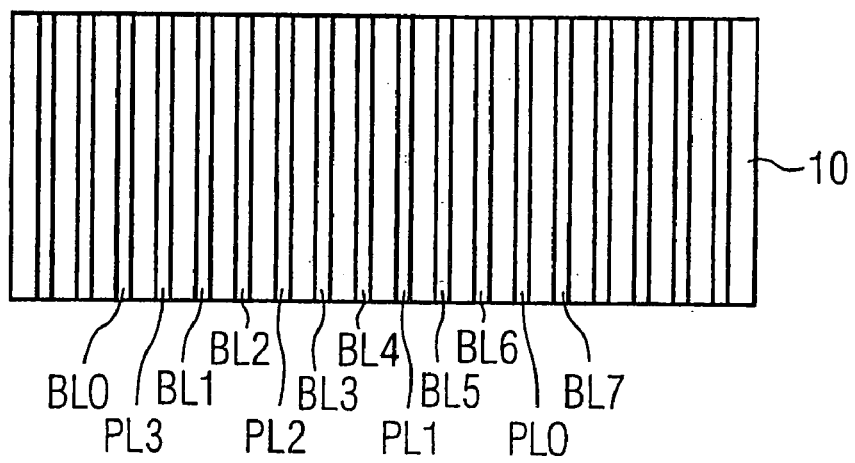
FIG. 2 shows a diagrammatic plan view of a memory component having distributed test lines.

FIG. 2 illustrates the arrangement of data lines and further data lines of an IC memory chip 10. The number of data lines and further data lines is arbitrary; in particular, only one data line and/or only one further data line need(s) to be present. The further data lines are arranged in the vicinity of the data lines or are arranged between the data lines or interlaced therewith, so that it is not possible, or it is at best possible with considerable outlay, to change the data carried on the data lines (in this case: bit lines) separately from the data carried on the further data lines (in this case: test lines) and, separately therefrom, likewise to change the check bits carried on the further data lines so that they match the changed data. The strips depicted in FIG. 2 may, for example, be the bit lines of an EEPROM. The bit lines BL0, BL1, BL2, BL3, BL4, BL5, BL6 and BL7 are provided as data lines for transmitting information. The test lines PL0, PL1, PL2 and PL3 are arranged between the bit lines in such a manner that it is not possible, or it is at best possible with considerable outlay, to change the data transmitted on the bit lines without also changing the further data on the test lines. Any change to the data by external electromagnetic or radioactive irradiation thus leads to the situation where the (randomly changed) check bits, check digits or code numbers for data correction which have actually been transmitted allow the conclusion to be drawn of a change in the (randomly changed) information transmitted on the data lines which is so considerable that an attempt at manipulation by external irradiation may be assumed and appropriate countermeasures may possibly be initiated.

Figure 3:
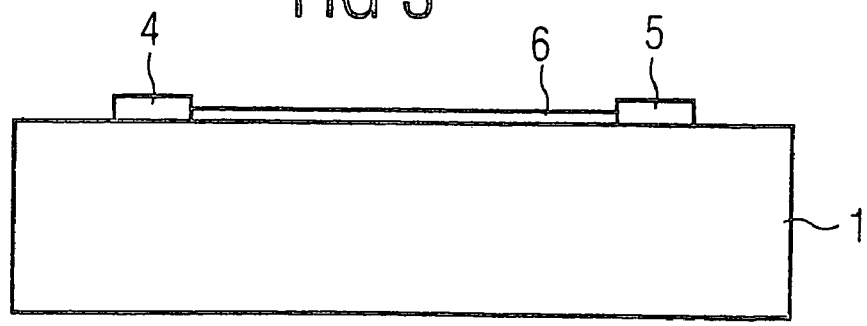
FIG. 3 shows a diagrammatic cross section through an IC chip having connecting structures comprising dielectric material of radiation-dependent electrical resistance.

FIG. 3 illustrates a diagrammatic cross section of a further exemplary embodiment, in which the IC chip is provided on the top side with a conductor structure having radiation-dependent electrical resistance. A semiconductor body or substrate 1 is shown again here, the more precise configuration of which is in principle arbitrary. Conductors 4, 5 (between which a dielectric material is arranged as connection 6) are present here on the top side of the substrate, in particular on the top side of the metallization planes and intermetal dielectrics (arranged above the actual semiconductor body) for the electrical interconnection. In one preferred refinement, the material is selected in such a manner that its relative permittivity changes in the event of external electromagnetic or radioactive irradiation or its electrical resistance decreases in the event of irradiation of this type. The conductors 4, 5 may, in particular, be parts of a patterned shield.

In the event of external irradiation, it is possible to detect the accompanying change in capacitance between the electrical conductors 4, 5 and/or an increase in the electrical conductivity of the connection 6 present between the latter. If the resistance of the material of the connection 6 has decreased by at least a particular predetermined value, it may be assumed that the integrated circuit is being manipulated by external irradiation. In this case, appropriate countermeasures may be initiated as required.

What is claimed is:

1. An IC chip, comprising:
    a substrate;
    an integrated circuit formed on the substrate and having at least one first electrical conductor; and
    a protective structure comprising a second electrical conductor formed in the substrate and in which external electromagnetic or radioactive irradiation generates free charge carriers which give rise to a current flow in and during operation of the integrated circuit,
    wherein the integrated circuit detects the rise in the current flow within the second electric conductor.

2. The IC chip as claimed in claim 1, further comprising:
    a plurality of first electrical conductors provided as data lines and having interconnects,
    wherein the second electrical conductor is a doped region formed in the substrate and arranged parallel to a respective interconnect.

3. The IC chip as claimed in claim 1, wherein the at least one first electrical conductor is spaced apart from the second electrical conductor.

4. The IC chip as claimed in claim 1, wherein the second electrical conductor is laterally offset with respect to the at least one first electrical conductor.

5. The IC chip as claimed in claim 1, wherein there are a plurality of first electrical conductors, and the second electrical conductor has strip-type doped regions arranged between the regions of the substrate provided with the first electrical conductors.

6. The IC chip as claimed in claim 1, wherein the integrated circuit is part of an EEPROM.

7. A smart card comprising the IC chip of claim 1.

8. A chip module comprising the IC chip of claim 1.

* * * * *